(12) United States Patent
Botula et al.

(10) Patent No.: US 7,772,083 B2
(45) Date of Patent: Aug. 10, 2010

(54) TRENCH FORMING METHOD AND STRUCTURE

(75) Inventors: Alan Bernard Botula, Essex Junction, VT (US); Michael Lawrence Gautsch, Jericho, VT (US); Alvin Jose Joseph, Williston, VT (US); Max Gerald Levy, Essex Junction, VT (US); James Albert Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 12/344,733

(22) Filed: Dec. 29, 2008

(65) Prior Publication Data

US 2010/0164075 A1    Jul. 1, 2010

(51) Int. Cl.
*H01L 21/76* (2006.01)
(52) U.S. Cl. .............. 438/424; 438/700; 257/510; 257/622
(58) Field of Classification Search .......... 438/561, 438/700, 424, 433, 42, 445, 373; 257/501, 257/510, 758, 750, 622, 626
See application file for complete search history.

(56) References Cited

U.S. PATENT DOCUMENTS

| | | | |
|---|---|---|---|
| 4,740,480 A | 4/1988 | Ooka | |
| 6,010,948 A | 1/2000 | Yu et al. | |
| 7,504,704 B2 * | 3/2009 | Currie et al. | 257/510 |
| 7,626,234 B2 * | 12/2009 | Inoue et al. | 257/374 |
| 2003/0235959 A1 | 12/2003 | Lichtenberger et al. | |
| 2007/0178660 A1 * | 8/2007 | Miller et al. | 438/424 |
| 2007/0298596 A1 * | 12/2007 | Lee et al. | 438/514 |
| 2008/0179684 A1 * | 7/2008 | Liang et al. | 257/369 |

* cited by examiner

*Primary Examiner*—S. V Clark
(74) *Attorney, Agent, or Firm*—Schmeiser, Olson & Watts; Richard M. Kotulak

(57) ABSTRACT

An electrical structure and method of forming. The method includes providing a semiconductor structure comprising a semiconductor substrate, a buried oxide layer (BOX) formed over the semiconductor substrate, and a silicon on insulator layer (SOI) formed over and in contact with the BOX layer. The SOI layer comprises shallow trench isolation (STI) structures formed between electrical devices. A first photoresist layer is formed over the STI structures and the electrical devices. Portions of said first photoresist layer, portions of the STI structures, and portions of the BOX layer are removed resulting in formed trenches. Ion implants are formed within portions of the semiconductor substrate. Remaining portions of the first photoresist layer are removed. A dielectric layer is formed over the electrical devices and within the trenches. A second photoresist layer is formed over the dielectric layer. Portions of the second photoresist layer are removed.

20 Claims, 4 Drawing Sheets

TRENCH FORMING METHOD AND STRUCTURE

FIELD OF THE INVENTION

The present invention relates to a method for forming trenches in an electrical structure.

BACKGROUND OF THE INVENTION

Forming structures on a substrate typically comprises a complicated process with limited flexibility. Accordingly, there exists a need in the art to overcome at least one of the deficiencies and limitations described herein above.

SUMMARY OF THE INVENTION

The present invention provides a method comprising:

providing a semiconductor structure comprising a semiconductor substrate, a buried oxide layer (BOX) formed over and in contact with a surface of said semiconductor substrate, and an silicon on insulator layer (SOI) formed over and in contact with a surface of said BOX layer, wherein said SOI layer comprises shallow trench isolation (STI) structures formed between a plurality of active electrical devices;

forming a first photoresist layer over entire surfaces of said STI structures and over said plurality of active electrical devices;

simultaneously removing portions of said first photoresist layer existing between each active device of said plurality of active electrical devices;

simultaneously removing portions of said STI structures and portions of said BOX layer existing below said removed portions of said first photoresist layer resulting in trenches formed through said STI structures and said BOX layer, wherein said trenches are formed over portions of said surface of said semiconductor substrate resulting in said portions of said surface of said semiconductor substrate exposed within said trenches;

after simultaneously removing said portions of said STI structures and said portions of BOX layer, forming ion implants within portions of said semiconductor substrate, wherein said portions of said semiconductor substrate exist below each of said trenches;

after said forming said ion implants, simultaneously removing all remaining portions of said first photoresist layer;

forming a dielectric layer over said active electrical devices and within said trenches;

forming a second photoresist layer over said dielectric layer; and simultaneously removing first portions of said second photoresist layer existing over said active electrical devices resulting in second portions of said second photoresist layer remaining over portions of said dielectric layer within said trenches.

The present invention provides a structure comprising:

a semiconductor substrate comprising ion implants formed within first portions of said semiconductor substrate;

buried oxide (BOX) structures formed over and in contact with second portions of said semiconductor substrate, wherein each BOX structure of said BOX is formed over and in contact with an associated portion of said second portions of said semiconductor substrate, and wherein said first portions of said semiconductor substrate differ from said second portions of said semiconductor substrate;

a plurality of active electrical device structures formed over and in contact with a first group of BOX structures of said BOX structures, wherein each active electrical device structure of said plurality of active electrical device structures comprises an active electrical device and a shallow trench isolation structure, wherein each said active electrical device structure is formed over an associated BOX structure of said first group of BOX structures, wherein trenches are formed between adjacent BOX structures of said first group of BOX structures, wherein each trench of said trenches is located over an associated ion implant of said ion implants, and wherein each said trench comprises a different size; and a dielectric layer formed over said active electrical device structures, over said BOX structures, and within said trenches, wherein a bottom surface of said dielectric layer is in contact with said ion implants and said active electrical device structures, wherein a top surface of said dielectric layer comprises a planar surface, and wherein said top surface of said dielectric layer is not in contact with any material.

The present invention advantageously provides a simple structure and associated method for forming structures on a substrate.

DETAILED DESCRIPTION OF THE INVENTION

FIGS. 1-7 illustrate and describe stages in a fabrication process of a semiconductor structure 2, in accordance with embodiments of the present invention. The electrical structure 2 illustrated in FIGS. 1-7 is a cross sectional view. The semiconductor structure 2 may comprise any semiconductor structure known to a person of ordinary skill in the art including, inter alia, a semiconductor device, a semiconductor chip, etc. The fabrication process described with respect to FIGS. 1-7 comprises the formation of a semiconductor structure comprising ion implants 18 and a planar surface 20e (i.e., see FIG. 7).

Figure 1:
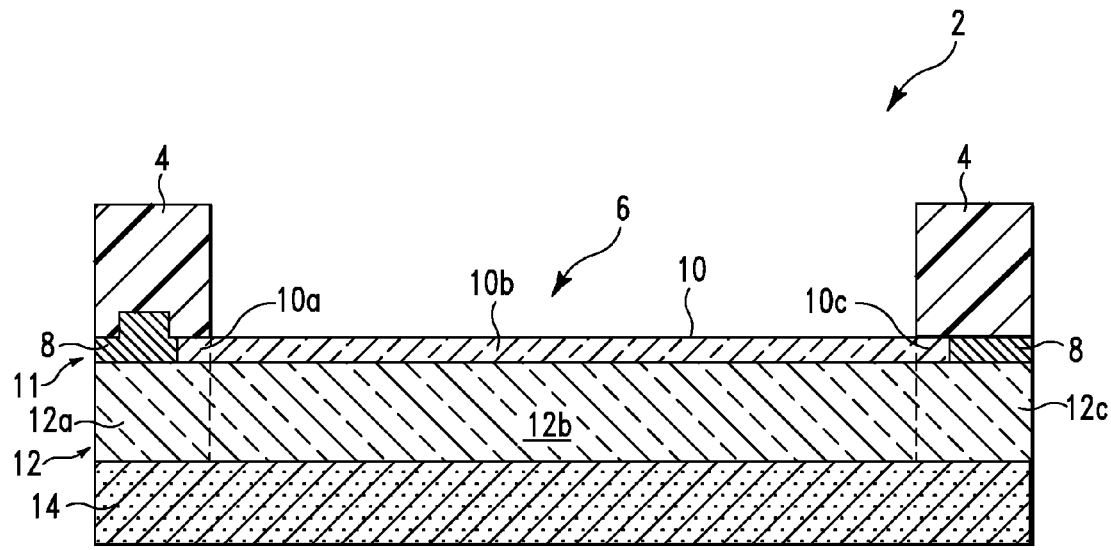
FIG. 1 illustrates a cross sectional view of a semiconductor structure provided for the fabrication process, in accordance with embodiments of the present invention.

FIG. 1 illustrates the semiconductor structure 2 provided for the fabrication process, in accordance with embodiments of the present invention. Note that the semiconductor structure 2 comprises a small portion of a semiconductor structure. Semiconductor structure 2 comprises a semiconductor substrate 14 (e.g., a semiconductor wafer) with a buried oxide (BOX) layer 12 (i.e., an insulator) formed over and in contact with the semiconductor substrate 14 and a silicon on insulator (SOI) layer 11 formed over and in contact with the BOX layer 12. Electrical structure 2 additionally comprises a photoresist layer 4. A portion of the photoresist layer 4 has been removed resulting in a formed opening 6 within the photoresist layer 4. The removed portion of the photoresist layer 4 was patterned and removed using a photolithography process. The photolithography process used to pattern and remove the portions of photoresist layer 4 comprises the use of a first mask for patterning. The SOI layer 11 comprises shallow trench isolation (STI) structures 10 (i.e., an insulator) formed between electrical devices 8. The electrical devices 8 may comprise active electrical devices or inactive electrical devices. An active electrical device may comprise any type of active electrical device including, inter alia, transistors, resistors, capacitors, etc. Inactive electrical devices comprise silicon structures that have not been formed into active electrical devices. The photoresist layer 4 (i.e., the remaining portions of the photoresist layer) is formed over the electrical devices 8. The STI structures 10 comprise portions 10a, 10b, and 10c. The BOX layer comprises portions 12a, 12b, and 12c.

Figure 2:
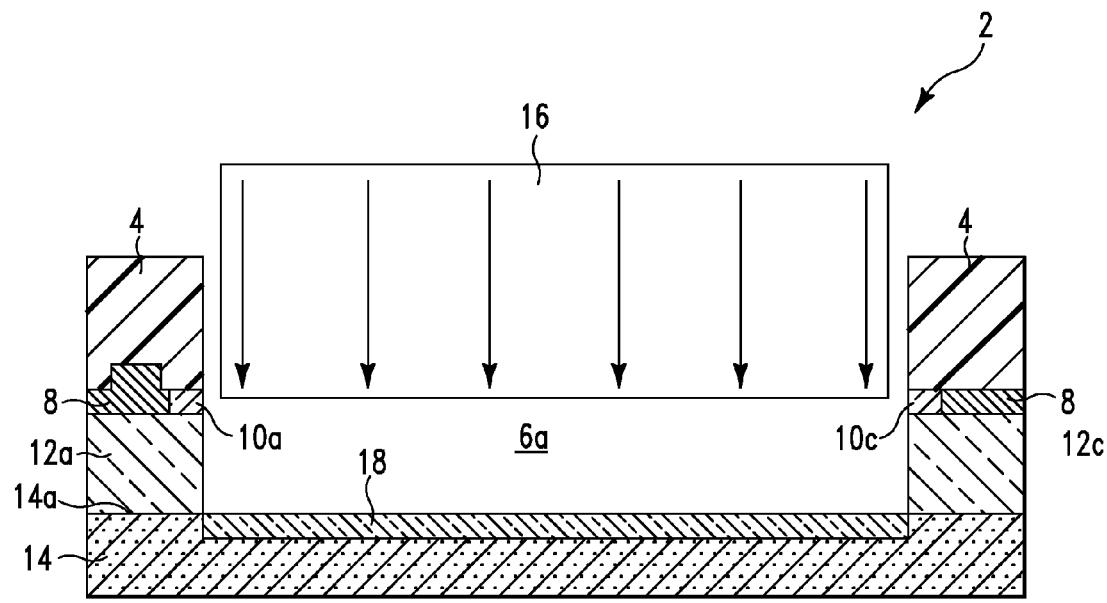
FIG. 2 illustrates a cross sectional view of the semiconductor structure of FIG. 1 after a portion of a shallow trench isolation structures and a portion of a buried oxide layer have been removed, in accordance with embodiments of the present invention.

FIG. 2 illustrates the semiconductor structure 2 of FIG. 1 after portion 10b of the STI structures 10 and portion 12b of the BOX layer 12 have been removed, in accordance with embodiments of the present invention. The removed portions 10b and 12b form an opening 6a (e.g., a trench, a via, etc) that exposes a portion of a top surface 14a of the semiconductor substrate 14. Note that the electrical structure 2 may comprise a plurality of openings similar to the opening 6a and that each opening may comprise a different size (e.g., a different size for a width, a depth, a length, etc) and/or shape (e.g., square, circular, etc). Portions 10b and 12b may be removed using any process including, inter alia, creating a pattern using a photoresist process (i.e., using photoresist layer 4) to create the pattern and using a reactive ion etch process using a standard fluorine-containing RIE chemistry. Portions 10b and 12b are then stripped away to create opening 6a. ION implants 18 are then formed in the exposed portion of the top surface 14a of the semiconductor substrate 14. The ion implants are formed by exposing the portion of the top surface 14a of the semiconductor substrate 14 to an ion beam 16 comprising an energy level of about 50 thousand electron volts (keV) to about 1.5 million electron volts (meV). The photoresist layer 4 over the electrical devices 8 protects or screens the electrical devices 8 from the ion implant process.

Figure 3:
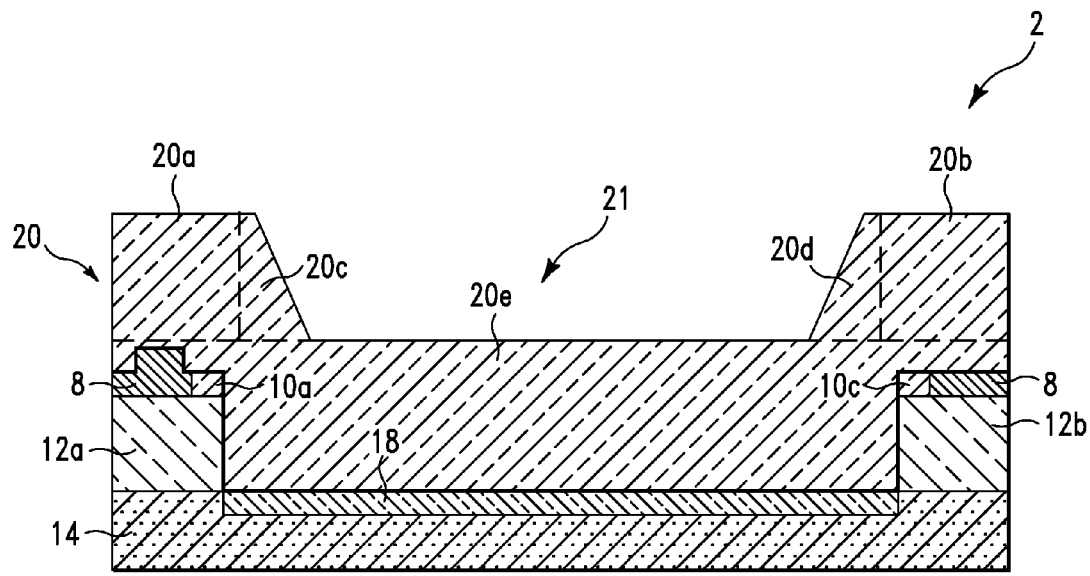
FIG. 3 illustrates a cross sectional view of the semiconductor structure of FIG. 2 after all of a photoresist layer has been removed and a dielectric contact layer has been formed over electrical devices, in accordance with embodiments of the present invention.

FIG. 3 illustrates the semiconductor structure 2 of FIG. 2 after all of the photoresist layer 4 has been removed and a dielectric contact layer 20 has been formed over the electrical devices 8 and within opening 6a, in accordance with embodiments of the present invention. The photoresist layer 4 may be removed using an ozone and/or wet etching process. Note that although the dielectric contact layer 20 illustrated in FIG. 3 only comprises one dielectric layer, the dielectric contact layer 20 may comprise a plurality of dielectric layers. The dielectric contact layer 20 may comprise any dielectric insulating material including, inter alia, oxide (e.g., silicon dioxide, doped silicon dioxide, undoped silicon dioxide, etc), silicon nitride, boro-phospho-silicate glass, borosilicate glass, phosphosilicate glass, or any combination thereof. The dielectric contact layer 20 may be deposited over the electrical devices 8 and within opening 6a using any technique including, inter alia, a chemical vapor deposition process, a TEOS deposition process, a plasma deposition process, etc. The dielectric contact layer 20 comprises portions 20a . . . 20e.

Figure 4:
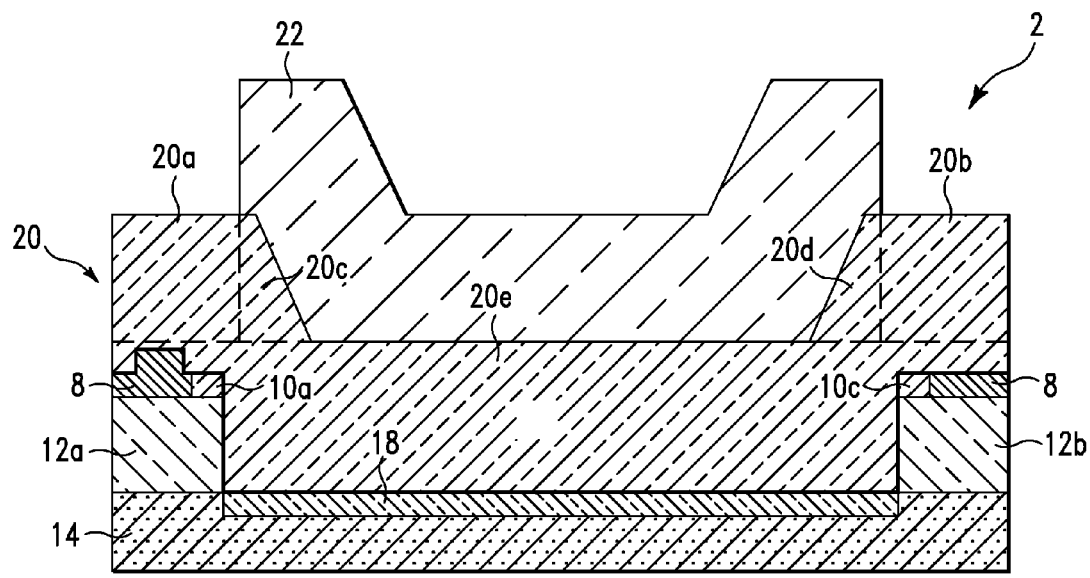
FIG. 4 illustrates a cross sectional view of the semiconductor structure of FIG. 3 after a second photoresist layer has been formed, in accordance with embodiments of the present invention.

FIG. 4 illustrates the semiconductor structure 2 of FIG. 3 after a second photoresist layer 22 has been formed, in accordance with embodiments of the present invention. Portions of the photoresist layer 22 have been removed resulting in a exposed portions 20a and 20b of dielectric layer 20. The removed portions of the photoresist layer 22 were patterned and removed using a photolithography process. The photolithography process used to pattern and remove the portions 22a and 22b of the photoresist layer comprises the use of a second mask for patterning. The second mask used to pattern the photoresist layer 22 may comprise an opposite pattern from the first mask used to pattern the photoresist layer 4 of FIG. 1. Alternatively, the second mask used to pattern the photoresist layer 22 may comprise a same pattern as the first mask used to pattern the photoresist layer 4 of FIG. 1 but a polarity of the photoresist layer 4 may comprise an opposite polarity from a polarity of the photoresist layer 22.

Figure 5:
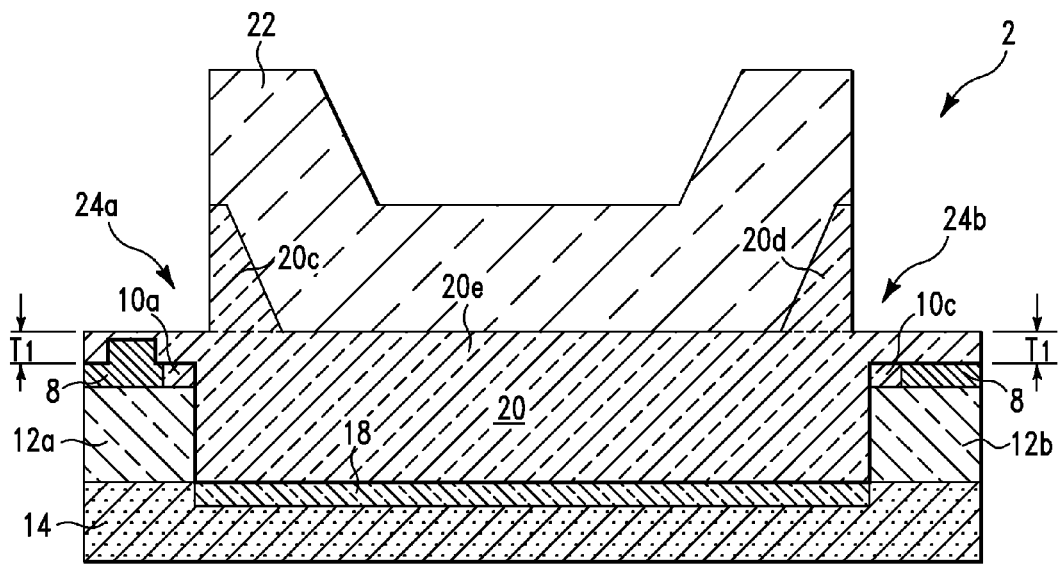
FIG. 5 illustrates a cross sectional view of the semiconductor structure of FIG. 4 after portions of the dielectric contact layer have been removed, in accordance with embodiments of the present invention

FIG. 5 illustrates the semiconductor structure 2 of FIG. 4 after the portions 20a and 20b of the dielectric contact layer 20 have been removed, in accordance with embodiments of the present invention. The removed portions 20a and 20b result in the formation of openings 24a and 24b. The openings 24a and 24b are located over the electrical devices 8. After portions 24a and 24b have been removed, a small portion of the dielectric contact layer 20 still remains over and in contact with electrical devices 8. The small portion of the dielectric contact layer 20 still remaining over and in contact with electrical devices 8 may comprise a thickness $T_1$ selected from a range of about 250 nanometers (nm) to about 2000 nm.

Figure 6:
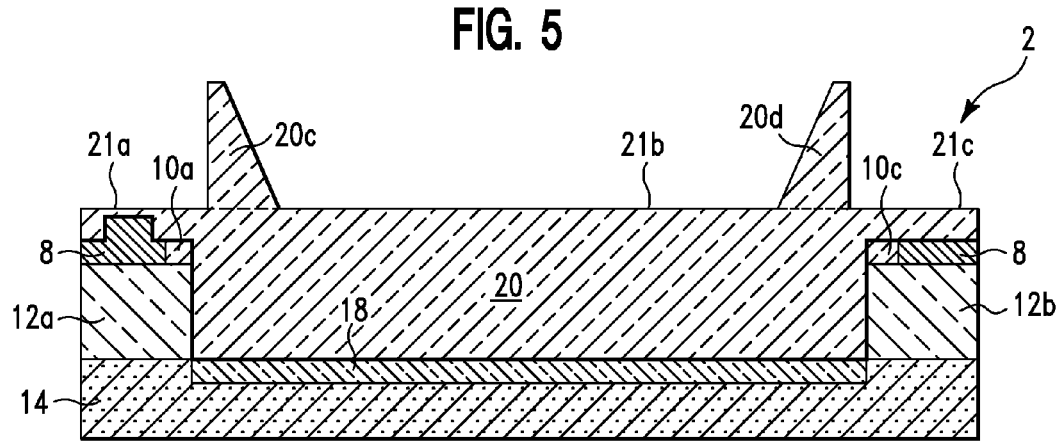
FIG. 6 illustrates a cross sectional view of the semiconductor structure of FIG. 5 after the second photoresist layer has been removed, in accordance with embodiments of the present invention.

FIG. 6 illustrates the semiconductor structure 2 of FIG. 5 after the photoresist layer 22 has been removed, in accordance with embodiments of the present invention. The photoresist layer 22 may be removed using an ozone and/or wet etching process. Portions 21a, 21b, and 21c of a top surface 21 of dielectric layer 20 are all coplanar.

Figure 7:
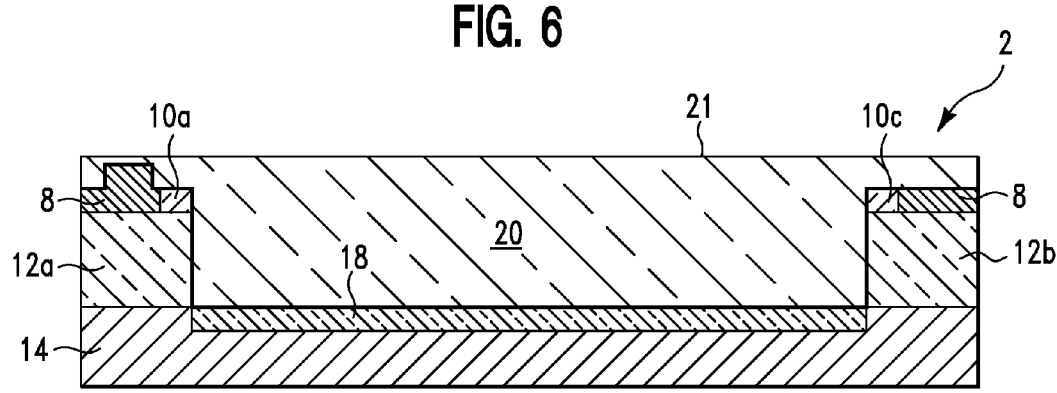
FIG. 7 illustrates a cross sectional view of the semiconductor structure of FIG. 6 after portions of the dielectric layer have been removed, in accordance with embodiments of the present invention.

FIG. 7 illustrates the semiconductor structure 2 of FIG. 6 after portions 20c and 20d of the dielectric layer 20 have been removed, in accordance with embodiments of the present invention. Portions 20c and 20d may be removed using chemical-mechanical process. Removing the portions 20c and 20d of the dielectric layer 20 results in a planer top surface 21 of dielectric layer 20.

Figure 8:
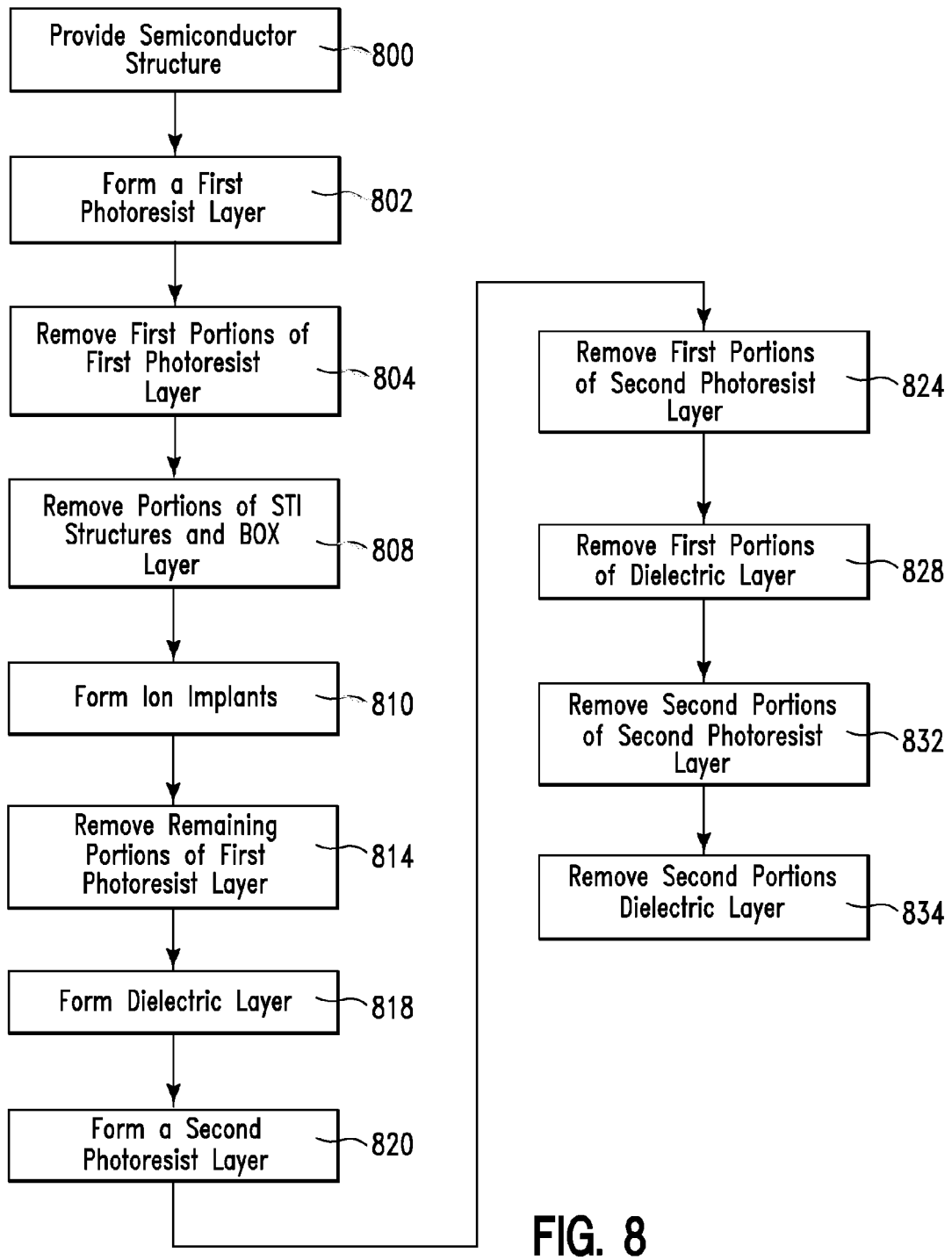
FIG. 8 illustrates an algorithm describing a process for forming the semiconductor structure of FIG. 7, in accordance with embodiments of the present invention.

FIG. 8 illustrates an algorithm describing a process for forming the semiconductor structure 2 of FIG. 7, in accordance with embodiments of the present invention. In step 800, a semiconductor structure is provided. The semiconductor structure comprises a semiconductor substrate (e.g., semiconductor substrate 14 of FIG. 1), a BOX layer (e.g., BOX layer 12 of FIG. 1) formed over and in contact with a top surface of the semiconductor substrate, and an SOI layer (e.g., SOI layer 11 of FIG. 1) formed over and in contact with a surface of the BOX layer. The SOI layer comprises STI structures (e.g., STI structure 10 of FIG. 1) formed between a plurality of electrical devices (e.g., electrical devices 8 of FIG. 1). In step 802, a first photoresist layer (e.g., photoresist layer 4 of FIG. 1) is formed over entire surfaces of the STI structures and over the plurality of electrical devices. In step 804, first portions of the first photoresist layer existing between each active device of the plurality of electrical devices are removed (e.g., simultaneously). In step 808, portions of the STI structures and portions of the BOX layer existing below the removed portions of the first photoresist layer are removed. The removed portions of the portions of the STI structures and the BOX layer result in the formation of openings (e.g., trenches, opening 6a of FIG. 2, etc) formed through the STI structures and the BOX layer. The openings are formed over portions of the top surface of the semiconductor substrate. The openings result in the portions of the top surface of the semiconductor substrate becoming exposed within the openings. In step 810, (i.e., after step 808 is executed), ion implants (e.g., ion implant 18 of FIG. 1) are formed within the exposed portions of the semiconductor substrate (i.e., below each of the openings). In step 814, all remaining portions of said first photoresist layer are removed (e.g., simultaneously). In step 818, a dielectric layer(s) (e.g., dielectric layer 20 of FIG. 3) is formed over the electrical devices and within the openings. In step 820, a second photoresist layer is formed (e.g., photoresist layer 22 of FIG. 4) over the dielectric layer. In step 824, first portions of the second photoresist layer existing over the plurality of electrical devices are removed (e.g., simultaneously). The aforementioned step 824 results in second portions of second photoresist layer remaining over portions of the dielectric layer within the openings. In step 828, first portions of the dielectric layer existing over the electrical devices are removed (e.g., simultaneously). In step 832, second portions of the second photoresist layer are removed (e.g., simultaneously). In step 834, second portions of the dielectric layer are removed (e.g., simultaneously) resulting a formation of a planar top surface of the dielectric layer (e.g., top surface 21 IN FIG. 7).

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method comprising:
    providing a semiconductor structure comprising a semiconductor substrate, a buried oxide layer (BOX) formed over and in contact with a surface of said semiconductor substrate, and an silicon on insulator layer (SOI) formed over and in contact with a surface of said BOX layer, wherein said SOI layer comprises shallow trench isolation (STI) structures formed between a plurality of active electrical devices;
    forming a first photoresist layer over entire surfaces of said STI structures and over said plurality of active electrical devices;
    simultaneously removing portions of said first photoresist layer existing between each active device of said plurality of active electrical devices;
    simultaneously removing portions of said STI structures and portions of said BOX layer existing below said removed portions of said first photoresist layer resulting in trenches formed through said STI structures and said BOX layer, wherein said trenches are formed over portions of said surface of said semiconductor substrate resulting in said portions of said surface of said semiconductor substrate exposed within said trenches;
    after simultaneously removing said portions of said STI structures and said portions of BOX layer, forming ion implants within portions of said semiconductor substrate, wherein said portions of said semiconductor substrate exist below each of said trenches;
    after said forming said ion implants, simultaneously removing all remaining portions of said first photoresist layer;
    forming a dielectric layer over said active electrical devices and within said trenches;
    forming a second photoresist layer over said dielectric layer; and
    simultaneously removing first portions of said second photoresist layer existing over said active electrical devices resulting in second portions of said second photoresist layer remaining over portions of said dielectric layer within said trenches.

2. The method of claim 1, further comprising:
    simultaneously removing first portions of said dielectric layer existing over said active electrical devices;
    simultaneously removing said second portions of said second photoresist layer; and
    simultaneously removing second portions of said dielectric layer resulting in a formation of a planar top surface of said dielectric layer.

3. The method of claim 2, wherein said simultaneously removing said second portions of said dielectric layer comprises using a chemical/mechanical polishing process.

4. The method of claim 2, wherein portions of said dielectric layer existing over said active electrical devices each comprise a specified thickness selected from a range of about 250 nanometers (nm) to about 2000 nm.

5. The method of claim 1, wherein each said trench comprises a different size.

6. The method of claim 1, wherein each said trench comprises a different shape.

7. The method of claim 1, wherein said first photoresist layer comprises a first photoresist material comprising a first polarity, wherein said second photoresist layer comprises a second photoresist material comprising a second polarity, and wherein said first polarity comprises an opposite polarity from said second polarity.

8. The method of claim 1, wherein said simultaneously removing said portions of said first photoresist layer comprises the use of a first mask, wherein said simultaneously removing said first portions of said second photoresist layer comprises the use of a second mask comprising an opposite pattern to said first mask.

9. The method of claim 1, wherein said simultaneously forming said ion implants comprises exposing said portions of said semiconductor substrate to an ion beam comprising an energy level selected from a range of about 50 keV to about 1.5 meV.

10. The method of claim 1, wherein each said trench comprises a different trench width between sidewalls of each said trench.

11. The method of claim 1, wherein said dielectric layer comprises a plurality of dielectric layers.

12. The method of claim 1, wherein said dielectric layer comprises a material selected for the group consisting of silicon nitride, silicon dioxide, a combination of silicon nitride and silicon dioxide, boro-phospho-silicate glass, borosilicate glass, and phosphosilicate glass.

13. A structure comprising:
    a semiconductor substrate comprising ion implants formed within first portions of said semiconductor substrate;
    buried oxide (BOX) structures formed over and in contact with second portions of said semiconductor substrate, wherein each BOX structure of said BOX is formed over and in contact with an associated portion of said second portions of said semiconductor substrate, and wherein said first portions of said semiconductor substrate differ from said second portions of said semiconductor substrate;

a plurality of active electrical device structures formed over and in contact with a first group of BOX structures of said BOX structures, wherein each active electrical device structure of said plurality of active electrical device structures comprises an active electrical device and a shallow trench isolation structure, wherein each said active electrical device structure is formed over an associated BOX structure of said first group of BOX structures, wherein trenches are formed between adjacent BOX structures of said first group of BOX structures, wherein each trench of said trenches is located over an associated ion implant of said ion implants, and wherein each said trench comprises a different size; and a dielectric layer formed over said active electrical device structures, over said BOX structures, and within said trenches, wherein a bottom surface of said dielectric layer is in contact with said ion implants and said active electrical device structures, wherein a top surface of said dielectric layer comprises a planar surface, and wherein said top surface of said dielectric layer is not in contact with any material.

14. The structure of claim 13, wherein portions of said dielectric layer existing over said active electrical device structures each comprise a specified thickness selected from a range of about 250 nm to about 2000 nm.

15. The structure of claim 13, wherein each said trench comprises a different trench width between sidewalls of each said trench.

16. The structure of claim 13, wherein each said trench extends into a top surface of said semiconductor substrate.

17. The structure of claim 13, wherein each said trench comprises a different shape.

18. The structure of claim 13, wherein said dielectric layer comprises a plurality of dielectric layers.

19. The structure of claim 13, wherein said dielectric layer comprises a material selected for the group consisting of silicon nitride, silicon dioxide, a combination of silicon nitride and silicon dioxide, boro-phospho-silicate glass, borosilicate glass, and phosphosilicate glass.

20. The structure of claim 13, further comprising:

a plurality of non-active electrical device structures formed over and in contact with a second group of BOX structures of said BOX structures, wherein each non-active electrical device structure of said plurality of non-active electrical device structures comprises a non-active electrical device and a shallow trench isolation structure, wherein each said non-active electrical device structure is formed over an associated BOX structure of said second group of BOX structures, wherein additional trenches are formed between adjacent BOX structures of said second group of BOX structures, wherein each additional trench of said additional trenches is located over an associated ion implant of said ion implants, and wherein each said additional trench comprises a different size.

* * * * *